United States Patent
Stoeferle et al.

(10) Patent No.: US 11,848,400 B2
(45) Date of Patent: Dec. 19, 2023

(54) TUNING EMISSION WAVELENGTHS OF QUANTUM EMITTERS VIA A PHASE CHANGE MATERIAL

(71) Applicant: International Business Machines Corporation, Armonk, NY (US)

(72) Inventors: Thilo Hermann Curt Stoeferle, Rueschlikon (CH); Michael A. Becker, Adliswil (CH); Rainer F. Mahrt, Maennedorf (CH); Darius Urbonas, Adliswil (CH); Fabio Scafirimuto, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 17/352,880

(22) Filed: Jun. 21, 2021

(65) Prior Publication Data

US 2022/0406963 A1 Dec. 22, 2022

(51) Int. Cl.
*H01L 33/06* (2010.01)
*G02F 1/017* (2006.01)
(Continued)

(52) U.S. Cl.
CPC .......... *H01L 33/06* (2013.01); *G02F 1/01791* (2021.01); *H01L 33/0041* (2013.01);
(Continued)

(58) Field of Classification Search
CPC ... H10K 50/115; H01L 33/502; H01L 33/504; H01L 33/06; G02F 1/01; G02F 1/0147;
(Continued)

(56) References Cited

U.S. PATENT DOCUMENTS 5,145,792 A * 9/1992 Hirata ...................... H01S 5/34
257/14
6,522,795 B1 * 2/2003 Jordan .................. G02F 1/0115
385/10
(Continued)

FOREIGN PATENT DOCUMENTS

WO 2018181204 W 10/2018

OTHER PUBLICATIONS

Takahashi et al., Local control of emission energy of semiconductor quantum dots (Year: 2013).*
(Continued)

*Primary Examiner* — Sophia T Nguyen
(74) *Attorney, Agent, or Firm* — Grant M. McNeilly

(57) ABSTRACT

A device having a layered structure that includes a layer of phase change material and a matrix material layer having embedding quantum emitters is tuned. An electric field is applied through the matrix material layer and the layer of phase change material to change the emission wavelengths of the quantum emitters. A phase of the phase change material is changed, in a non-volatile manner, in each of one or more of local areas of the phase change material, to form local alterations that are opposite to respective ones of the quantum emitters in the matrix material layer, to locally modify the electric field at the respective quantum emitters.

13 Claims, 4 Drawing Sheets

(51) Int. Cl.
| | |
|---|---|
| *H01L 33/00* | (2010.01) |
| *H01L 33/36* | (2010.01) |
| *H01L 33/50* | (2010.01) |
| *H10K 50/81* | (2023.01) |
| *H10K 50/82* | (2023.01) |
| *H10K 71/00* | (2023.01) |

(52) U.S. Cl.
CPC ............ *H01L 33/36* (2013.01); *H01L 33/502* (2013.01); *H10K 50/81* (2023.02); *H10K 50/82* (2023.02); *H10K 71/00* (2023.02); *H01L 2933/0016* (2013.01); *H01L 2933/0041* (2013.01)

(58) Field of Classification Search
CPC .. H10N 70/235; H10N 70/231; H10N 70/801; H10N 70/8828; H10N 70/8833
See application file for complete search history.

(56) References Cited

U.S. PATENT DOCUMENTS

| | | | | |
|---|---|---|---|---|
| 7,068,865 | B2* | 6/2006 | Hamann | G02F 1/011 385/2 |
| 9,812,596 | B2* | 11/2017 | Cho | H01L 31/035218 |
| 10,529,879 | B2* | 1/2020 | Cho | H01L 31/1129 |
| 10,950,749 | B2* | 3/2021 | Lee | G02F 1/015 |
| 11,204,514 | B2* | 12/2021 | Lee | G02F 1/0311 |
| 2002/0114367 | A1 | 8/2002 | Stintz et al. | |
| 2004/0046176 | A1* | 3/2004 | Kim | H01L 31/101 257/E31.054 |
| 2005/0058425 | A1* | 3/2005 | Berini | G02B 6/1226 385/147 |
| 2006/0198404 | A1* | 9/2006 | Henrichs | H01S 5/18391 372/100 |
| 2009/0174022 | A1* | 7/2009 | Coe-Sullivan | H01L 31/0352 257/E31.124 |
| 2010/0119193 | A1* | 5/2010 | Englund | G02F 1/21 257/14 |
| 2011/0126891 | A1* | 6/2011 | Goto | H01L 27/14607 438/94 |
| 2012/0170097 | A1* | 7/2012 | Han | B82Y 20/00 977/932 |
| 2013/0155484 | A1* | 6/2013 | Sweatlock | G02F 1/23 359/282 |
| 2013/0342888 | A1* | 12/2013 | Donval | C09K 9/00 977/833 |
| 2014/0291490 | A1* | 10/2014 | Hanson | G02B 6/00 250/214 R |
| 2015/0001464 | A1* | 1/2015 | Fukuura | C09K 11/56 977/774 |
| 2015/0116721 | A1 | 4/2015 | Kats et al. | |
| 2015/0243849 | A1* | 8/2015 | Stroetmann | H01L 33/06 257/13 |
| 2016/0161644 | A1* | 6/2016 | Verschuuren | G02B 5/008 359/241 |
| 2017/0018688 | A1* | 1/2017 | Mazed | H01L 27/14621 |
| 2017/0031183 | A1* | 2/2017 | Han | G02F 1/0121 |
| 2017/0031231 | A1* | 2/2017 | Bhaskaran | G02F 1/0147 |
| 2017/0084761 | A1* | 3/2017 | Cho | H01L 27/14647 |
| 2017/0221596 | A1* | 8/2017 | Caldwell | G21K 5/00 |
| 2018/0033988 | A1* | 2/2018 | Walter | H10K 50/115 |
| 2018/0046056 | A1* | 2/2018 | Na | G02F 1/21 |
| 2018/0145204 | A1* | 5/2018 | White | H01L 31/114 |
| 2018/0274977 | A1* | 9/2018 | Baik | G02B 5/1809 |
| 2019/0064551 | A1* | 2/2019 | Gooth | H10N 70/8833 |
| 2019/0064555 | A1* | 2/2019 | Hosseini | G02F 1/0147 |
| 2019/0079245 | A1 | 3/2019 | Grim et al. | |
| 2019/0079321 | A1* | 3/2019 | Wu | G02F 1/0555 |
| 2019/0107740 | A1* | 4/2019 | Lee | G02F 1/017 |
| 2019/0129206 | A1* | 5/2019 | Lee | G02F 1/01708 |
| 2019/0131491 | A1* | 5/2019 | Lee | H01L 33/60 |
| 2019/0212544 | A1* | 7/2019 | Heber | G02F 1/01 |
| 2019/0369420 | A1* | 12/2019 | Grim | G02F 1/01716 |
| 2020/0028074 | A1* | 1/2020 | Defferriere | H10N 70/8836 |
| 2020/0075812 | A1* | 3/2020 | Konstantatos | H01L 33/04 |
| 2020/0124881 | A1* | 4/2020 | Hosseini | G02F 1/19 |
| 2020/0194701 | A1* | 6/2020 | Kirov | H10K 50/115 |
| 2020/0363507 | A1* | 11/2020 | Cohen | G01S 7/484 |
| 2020/0409228 | A1* | 12/2020 | Carrillo | G02F 1/19 |
| 2021/0048693 | A1* | 2/2021 | Falk | H01Q 3/30 |
| 2022/0026777 | A1* | 1/2022 | Szczytko | G02F 1/216 |
| 2022/0082897 | A1* | 3/2022 | Zhou | G02F 1/092 |
| 2022/0134659 | A1* | 5/2022 | Leard | B29C 64/268 427/597 |
| 2022/0149315 | A1* | 5/2022 | Menon | G02B 5/008 |
| 2022/0344541 | A1* | 10/2022 | Bluhm | H01L 33/38 |
| 2022/0406963 | A1* | 12/2022 | Stoeferle | H01L 33/36 |
| 2023/0030910 | A1* | 2/2023 | Wang | C08J 7/042 |

OTHER PUBLICATIONS

Grim et al., Scalable in operando strain tuning in nanophotonic waveguides (Year: 2019).*
International Search Report and Written Opinion, International Application No. PCT/EP2022/066726, dated Oct. 17, 2022, 15 pgs.
Jamil et al., "Transition from conventional lasers to plasmonic spasers: a review," Applied Physics A (2021) 127:191; https://doi.org/10.1007/s00339-021-04351-w.
Türschmann et al., "On-chip linear and nonlinear control of single molecules coupled to a nanoguide", arXiv:1702.05923, 5 pages, Aug. 13, 2018.
Kimble, H.J., The Quantum Internet. Nature, 453, 1023-1030 (2008).
O'Brien, J. et al., "Photonic quantum technologies", Nature Photonics 3, 687-695, 9 pages (2009).
Zhang et. al., Broadband transparent optical phase change materials for high-performance nonvolatile photonics, Nature Communications 10,4279, 9 pages (2019).
Martinez, F.L. et al., "Optical properties and structure of HfO2 thin films grown by high pressure reactive sputtering", J. Phys. D: Appl. Phys. 40 (2007) 5256-5265.
Bennett, A.J., et al., "Electric-field-induced coherent coupling of the exciton states in a single quantum dot", Nature Physics, 6, 947-950, Oct. 2010.
Najer, D. et al., "A gated quantum dot strongly coupled to an optical microcavity", Nature, 575, 622-627, Nov. 28, 2019.
Saiki, T. et al., "Nanospectroscopy of single quantum dots with local strain control using a phase-change mask", Japanese Journal of Applied Physics 56, 08LA02 (2017).
Tsumori, N. et al., "Near-infrared nano-spectroscopy and emission energy control of semiconductor quantum dots using a phase-change material", IOP Publishing, 18th Microscopy of Semiconducting Materials Conference (MSM XVIII), Journal of Physics: Conference Series 471 (2013).
Wang, Y. et al.. "Structure and dielectric properties of amorphous high-k oxides: HfO2, ZrO2, and their alloys", Physical Review B 85, 224110 (2012).
Prokhorov, E. et al., "Dielectric properties of Ge2Sb2Te5 phase-change films", Journal of Applied Physics 113, 113705, 9 pages (2013).
Grim, J.Q. et al., "Scalable in operando strain tuning in nanophotonic waveguides enabling three quantum-dot superradiance", nature materials, vol. 18, pp. 963-969, Sep. 2019.

* cited by examiner

TUNING EMISSION WAVELENGTHS OF QUANTUM EMITTERS VIA A PHASE CHANGE MATERIAL

CONTRACT REFERENCES

The project leading to this application has received funding from Switzerland (QuantERA Project "RouTe", funded by Swiss National Science Foundation under grant agreement 20QT21_175389).

BACKGROUND

The present disclosure relates to tuning emission wavelengths of quantum emitters, and more specifically to a phase change material to locally modify an electric field at the quantum emitters.

Several quantum information processing concepts involve single-photon emitters (e.g., quantum emitters, such as molecules and quantum dots) and may be based on: (i) coupling on-chip emission of a single quantum emitter to optical cavity modes; or (ii) coupling individual quantum emitters with each other.

SUMMARY

According to embodiments, disclosed are a method, apparatus, and device.

According to a first aspect, the present disclosure is embodied as a method of tuning emission wavelengths of quantum emitters. The method relies on a device having a layered structure, e.g., a bilayer structure. The layered structure includes a layer of phase change material and a matrix material layer, where the latter embeds one or more quantum emitters. Then, an electric field is applied through the matrix material layer and the layer of phase change material to change the emission wavelengths of the quantum emitters, e.g., due to the Stark effect and other, related effects. Finally, a phase of the phase change material (PCM) is changed, in a non-volatile manner, in each of one or more local areas of the PCM, e.g., from amorphous to crystalline. That is, the phase of the PCM in the local areas is preferably changed from an essentially amorphous structure to an essentially crystalline structure, such that remaining portions of the PCM have an essentially amorphous structure.

These local areas form local phase alterations, which are opposite to (e.g., vis-à-vis) respective ones of the quantum emitters in the matrix material layer. This causes to locally modify the electric field at the respective quantum emitters. As a result, it is possible to individually tune the emission wavelength of the quantum emitters, e.g., in a programmatic way, by controllably changing the phase in selected areas of the PCM layer.

The modification of the electric field at the location of the emitter occurs because of the change in the static permittivity after the phase change, e.g., once the crystalline phase is reached. This makes it possible to change the local electric field strength experienced by each emitter and, therefore, the strength of the Stark effect. This, in turn, allows the emission wavelength of each quantum emitter to be individually tuned. The extent of the tuning depends on the geometry of the (phase-changed) local areas and the extent to which the phase is changed, e.g., the amount of crystallinity of the PCM in these areas.

Accordingly, the above method can advantageously be exploited in, e.g., quantum information processing applications and, more generally, in applications that require coupling electromagnetic emissions of (i) the individual quantum emitters with each other, (ii) the individual quantum emitters with a given wavelength of light (e.g., with remote quantum emitters), or (iii) a given quantum emitter with one or more optical cavity modes of a cavity including the layered structure, as in embodiments.

Preferably, the one or more local areas are first areas, which give rise to first local phase alterations, and the method further comprises restructuring the PCM layer by: (i) changing the phase of each of one or more of the first areas back to the amorphous structure, prior to (ii) changing a phase of each of one or more second local areas of the PCM from an amorphous structure to a crystalline structure. Like the first areas, the second local areas give rise to second local phase alterations, which are opposite to respective quantum emitters in the matrix material layer. They may, however, differ in terms of size and number. This again causes to locally modify the electric field at the respective quantum emitters, though to a different extent than before.

In preferred embodiments, the PCM is such that, after having changed the phase of the PCM in each of the one or more local areas, an average, static relative permittivity of the local areas is at least 1.5 times larger than an average, static relative permittivity of remaining portions of the PCM layer.

Preferably, the phase of the PCM is changed in each of the local areas using a radiation element that is controllably moved relative to the PCM layer. The radiation element includes one of a laser device and a heated nanoscale probe tip.

In preferred embodiments, the electric field is applied parallel to the matrix material layer. In variants, it is applied transversely to the layered structure.

According to another aspect, the disclosure is embodied as an apparatus comprising an emission device, an electrical circuit, and a radiation device. The emission device includes two electrodes and a layered structure. The latter comprises a PCM layer and a matrix material layer, which embeds quantum emitters. The matrix material layer extends over the PCM layer. It further extends between the two electrodes, e.g., in a vertical or horizontal (e.g., lateral) configuration. The electrical circuit is connected to the two electrodes and configured to generate, via the two electrodes, an electric field through the matrix material layer and the layer of phase change material, so as to change the emission wavelengths of the quantum emitters, in operation. The radiation device is configured to controllably change a phase of the PCM, in a non-volatile way, in each of one or more local areas of the PCM. Consistently with the first aspect of the disclosure, the local areas are opposite to (e.g., via-à-vis) respective ones of the quantum emitters in the matrix material layer. Changing the phase of the PCM in these areas causes to locally modify the electric field at the respective quantum emitters, in operation.

In embodiments, the radiation device comprises a radiation element, which is one of a laser device and a heatable nanoscale probe tip. The apparatus is configured to controllably move the radiation element relatively to the layered structure, to make it possible to easily change the phase of the PCM in the local areas.

For example, the apparatus may be configured to scan the layered structure with the radiation element, e.g., by laterally moving the layered structure and/or the radiation element. Note, a distance characterizing the lateral precision (in the sense of resolution) is preferably smaller than an average lateral separation distance between the quantum emitters.

The lateral separation distance is measured along a direction that is parallel to an average plane of the layered structure.

According to a final aspect, the disclosure is embodied as an emission device. The device includes a layered structure, the latter having a PCM layer and a matrix material layer embedding one or more quantum emitters. The matrix material layer extends over the PCM layer. In addition, the device includes two electrodes that are arranged on each side of the matrix material layer. The electrodes allow an electric field to be generated through the matrix material layer and the layer of phase change material to change the emission wavelengths of the quantum emitters, in operation. Consistently with the other aspects of the disclosure, the PCM further includes one or more local areas opposite to respective ones of the quantum emitters in the matrix material layer. The local areas have a phase that is distinct from that of remaining portions of the PCM layer. As a result, the local areas locally modify the electric field at the respective quantum emitters, in operation of the device.

The emission device typically includes a substrate, over which extends the PCM layer. E.g., the PCM layer is between the substrate and the matrix material layer. As noted above in respect of the previous aspect of the disclosure, the electrodes may have a vertical or a horizontal (e.g., lateral) configuration. For example, in a horizontal configuration, the electrodes may be patterned directly on the substrate, so as for the layered structure to extend between the electrodes.

Preferably, the PCM includes GeSbTe or HfO2. Besides, the matrix material layer may for instance comprise a crystalline material or a polymer material, while the quantum emitters may include epitaxially-grown semiconductor quantum dots, colloidal quantum dots, or organic emitters including dyes and other emitters such as oligomers. Other materials combinations can be contemplated.

In preferred embodiments, the average, static relative permittivity of the local areas is at least twice as large as an average, static relative permittivity of the remaining portions.

In embodiments, an average distance between the quantum emitters in the matrix material layer is larger than or equal to 50 nm. Furthermore, the average, in-plane dimension of the local areas is preferably between 50 and 5000 nm. All in-plane dimensions are measured along a direction that is parallel to an average plane of matrix material layer (or the layered structure). Meanwhile, an average thickness of the local areas is preferably larger than or equal to 1 nm; this thickness is measured perpendicularly to the matrix material layer, from an interface between the matrix material layer and the PCM layer.

The average thickness of the PCM layer is preferably between 50 nm and 200 nm, while the average thickness of the matrix material layer is preferably between 20 nm and 200 nm. Again, such thicknesses are measured perpendicularly to the respective layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
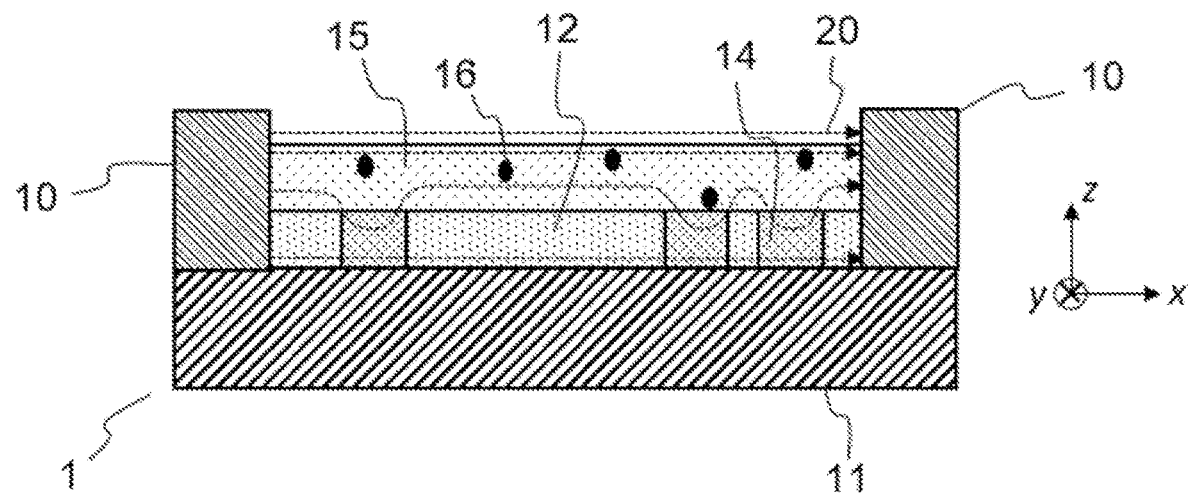
FIG. 1A depicts a two-dimensional cross-sectional view of an emission device, according to some embodiments of the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to tuning emission wavelengths of quantum emitters; more particular aspects relate to a phase change material to locally modify an electric field at the quantum emitters. While the present disclosure is not necessarily limited to such applications, various aspects of the disclosure may be appreciated through a discussion of various examples using this context.

Several quantum information processing concepts involve single-photon emitters (e.g., quantum emitters, such as molecules and quantum dots) and may be based on: (i) coupling on-chip the emission of a single quantum emitter to optical cavity modes; or (ii) coupling individual quantum emitters with each other.

Quantum emitters may rely on resonance with the cavity mode or the other quantum emitters, respectively. Most quantum emitters may have a slightly different emission wavelength, which results in an inhomogeneous spectral broadening of the ensemble emission. In order to achieve the desired coupling, the spectrally narrow emission spectra of the individual quantum emitters may need to overlap with the emission spectra of the other quantum emitters or the cavity mode spectrum.

Several techniques are known that attempt to tune the emission wavelength of quantum emitters, including, e.g., strain tuning and electric field tuning. However, such techniques cannot be used to individually tune multiple single emitters to overcome the detrimental effect of inhomogeneous broadening.

Figure 1B:
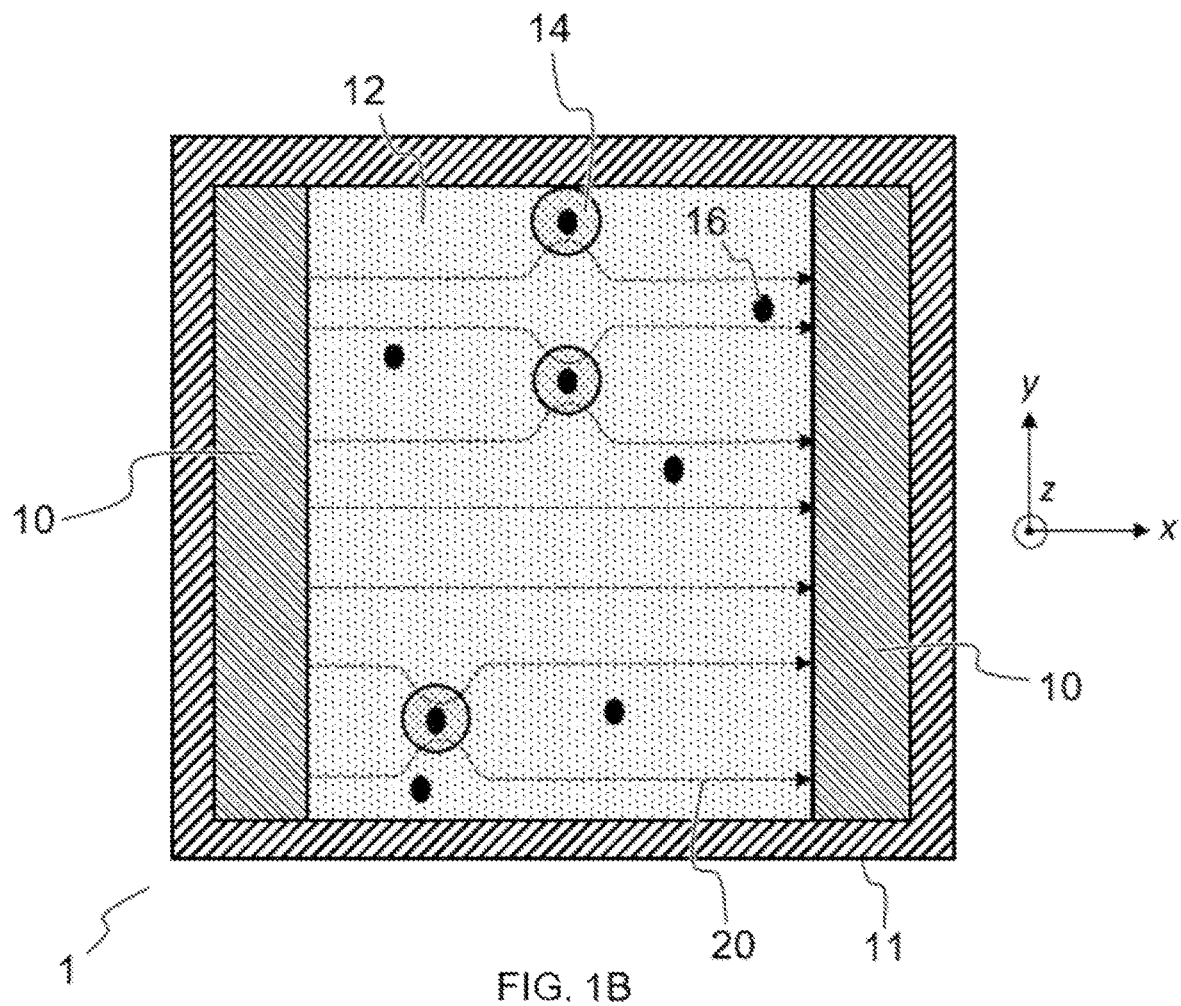
FIG. 1B depicts a two-dimensional top view of an emission device, according to some embodiments of the disclosure.
Figure 2A:
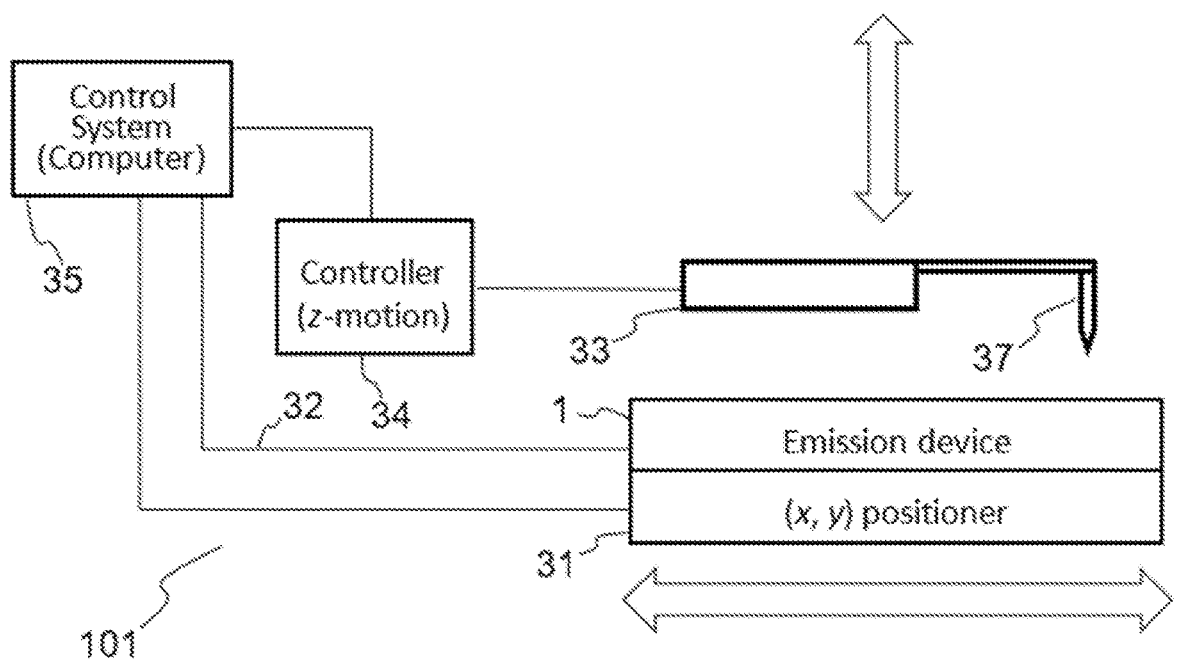
FIG. 2A depicts selected components of an apparatus according to some embodiments of the disclosure.
Figure 2A:
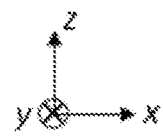
Figure 2B:
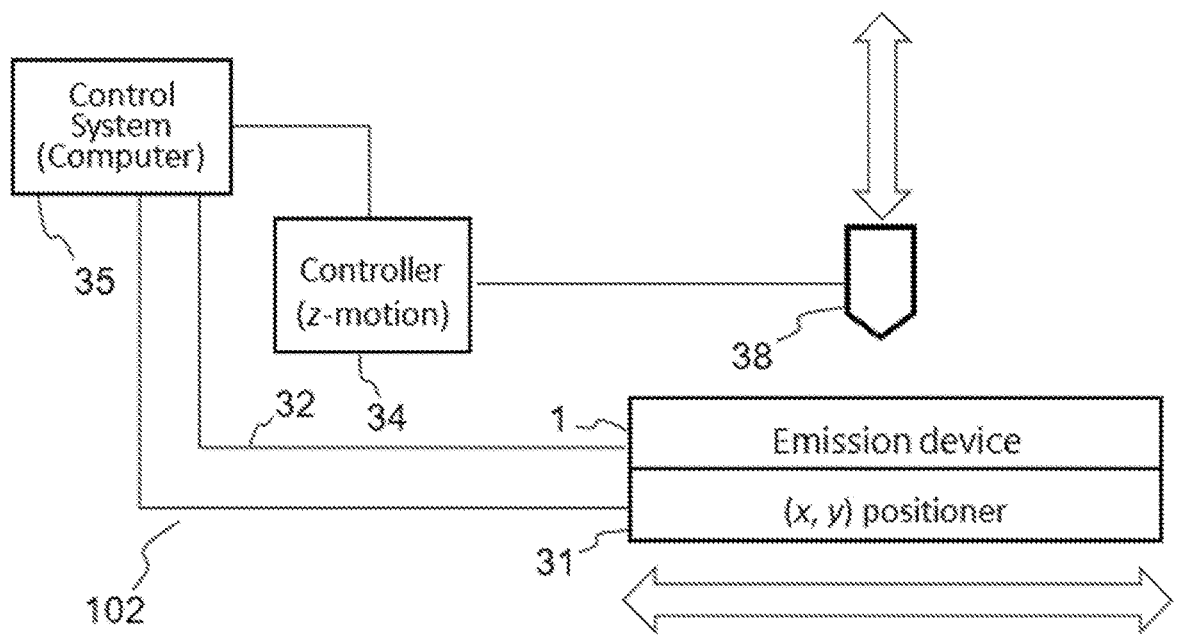
FIG. 2B depicts selected components of an apparatus according to some embodiments of the disclosure.
Figure 3:
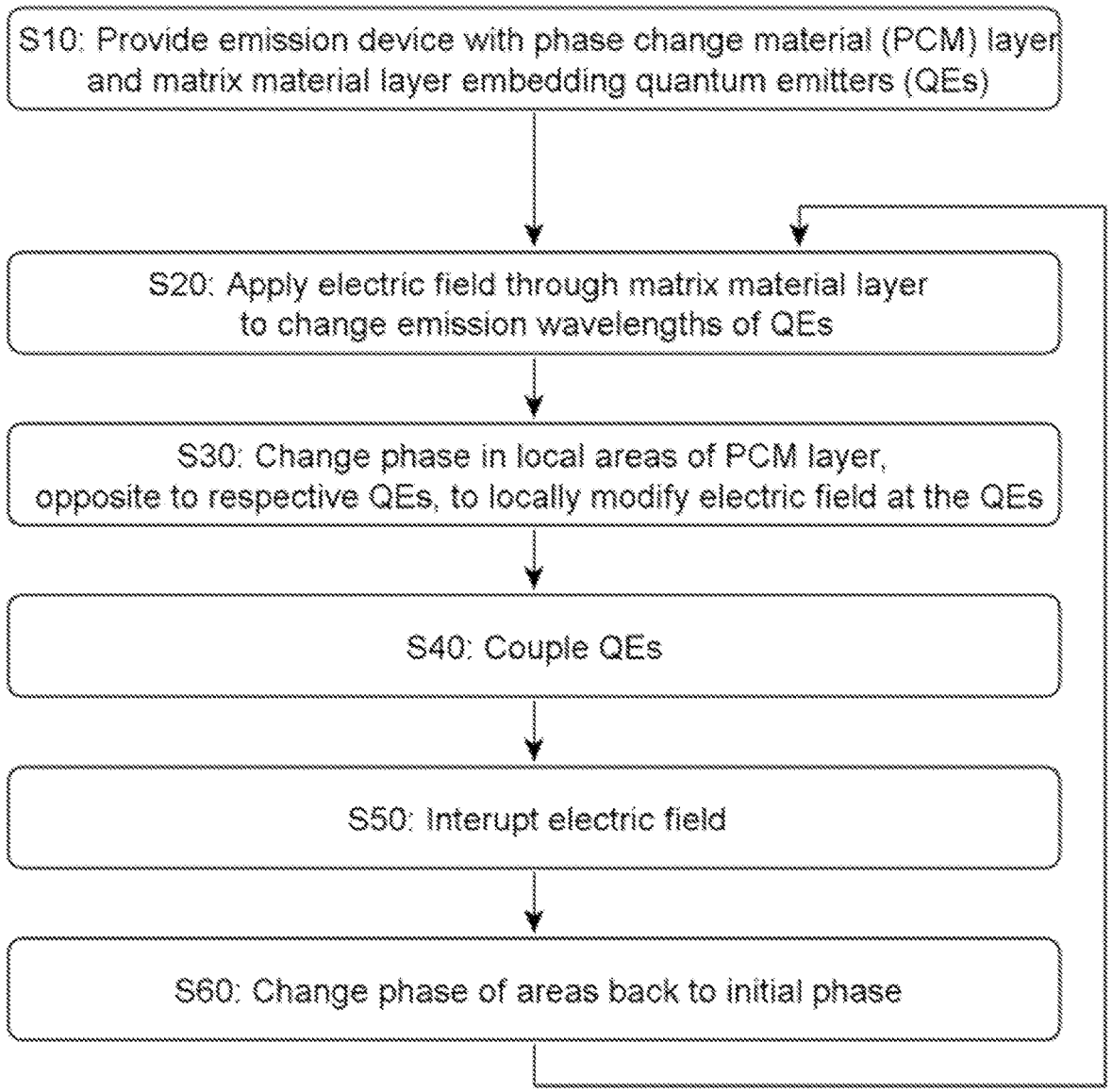
FIG. 3 depicts a flowchart illustrating a method of tuning emission wavelengths of quantum emitters, according to some embodiments of the disclosure.

In reference to FIGS. 1-3, an aspect of the disclosure is first described, which concerns a method of tuning emission wavelengths of quantum emitters 16.

FIGS. 2A and 2B may illustrate selected components of apparatuses according to embodiments. These apparatuses include, each, an emission device 1 such as shown in FIGS. 1A and 1B, as well as a radiation element(s) 37, 38. In each embodiment, the emission device 1 can be laterally moved with respect to the radiation element 37/38, to locally change the phase of one or more layers.

Implementing by way of methods may notably result in an emission device 1 such as shown in FIGS. 1A and 1B. The methods may notably be implemented using apparatuses 101 and/or 102 as shown in FIGS. 2A and 2B, respectively. In FIG. 2A, the radiation element 37/38 may be a heated, nanoscale probe tip, whereas, in FIG. 2B, the radiation element 37/38 may be a laser device. The present method and its variants are collectively referred to as "the present methods". All references Sn refer to methods steps of the flowchart of FIG. 3, while numeral references pertain to physical parts or components of the device 1 and apparatuses 101 and 102 shown in FIGS. 1 and 2. The device 1 and the apparatuses 101 and 102 concern other aspects of the disclosure, which are described later in detail.

The methods of FIGS. 2A and 2B may rely on an emission device, e.g., as provided at step S10 of the flowchart of FIG. 3. The emission device 1 may have a layered structure 12, 15, which includes a layer of phase change material (PCM) 12 and a matrix material layer 15. The layered structure 12, 15 may simply be a bilayer structure, as assumed in the accompanying drawings. However, the layered structure 12, 15 may possibly include an additional intermediate layer between the PCM layer 12 and the matrix material layer 15. This intermediate layer may for example be a bonding layer or a protective layer. However, the intermediate layer may be very thin, e.g., less than 10 nm thick, to preserve desired properties for the structure 12, 15, as explained below.

The matrix material layer 15 may have embedded one or more quantum emitters 16. E.g., at least one quantum emitter 16 is involved, although the matrix material 15 may include multiple (more than one) quantum emitters 16, as in FIGS. 1A and 1B. Quantum emitters 16 (also referred to as single-photon sources) may facilitate emission of one photon at a time, as opposed to classical light. Several types of active nanomaterials are known, which can be engineered into single quantum emitters 16 and spontaneous emission can be tuned by changing the local density of optical states in dielectric nanostructures. Quantum emitters can for instance be single atoms, ions, molecules, or defect centers. In the present context the quantum emitters may include solid-state emitters such as quantum dots, color centers, organic emitters, and carbon nanotubes. In some embodiments, the quantum emitters may be epitaxially-grown semiconductor quantum dots, colloidal quantum dots, or organic emitters, such as organic dyes, as discussed later in reference to another aspect of the disclosure.

At step S20, an electric field is applied through the matrix material layer 15 and the PCM layer 12. The electric field that is applied may be constant, e.g., static, normally constant. The applied field may cause to change the emission wavelengths of the quantum emitters 16, due to the Stark effect, or other related effects.

The electric field may be applied thanks to an electrical circuit 32 (see FIGS. 2A and 2B), via two electrodes 10, see FIGS. 1A and 1B. In the example of FIGS. 1A and 1B, the emission device 1 may include an optically and electrically passive substrate. In some embodiments, the substrate may not be emitting light and may be electrically insulating. Electrodes 10 of a conductive material may be patterned directly on this substrate 11. Thus, an electric voltage can be locally applied via the electrodes 10. The applied voltage may be in the range 1-100 V.

Figure 4:
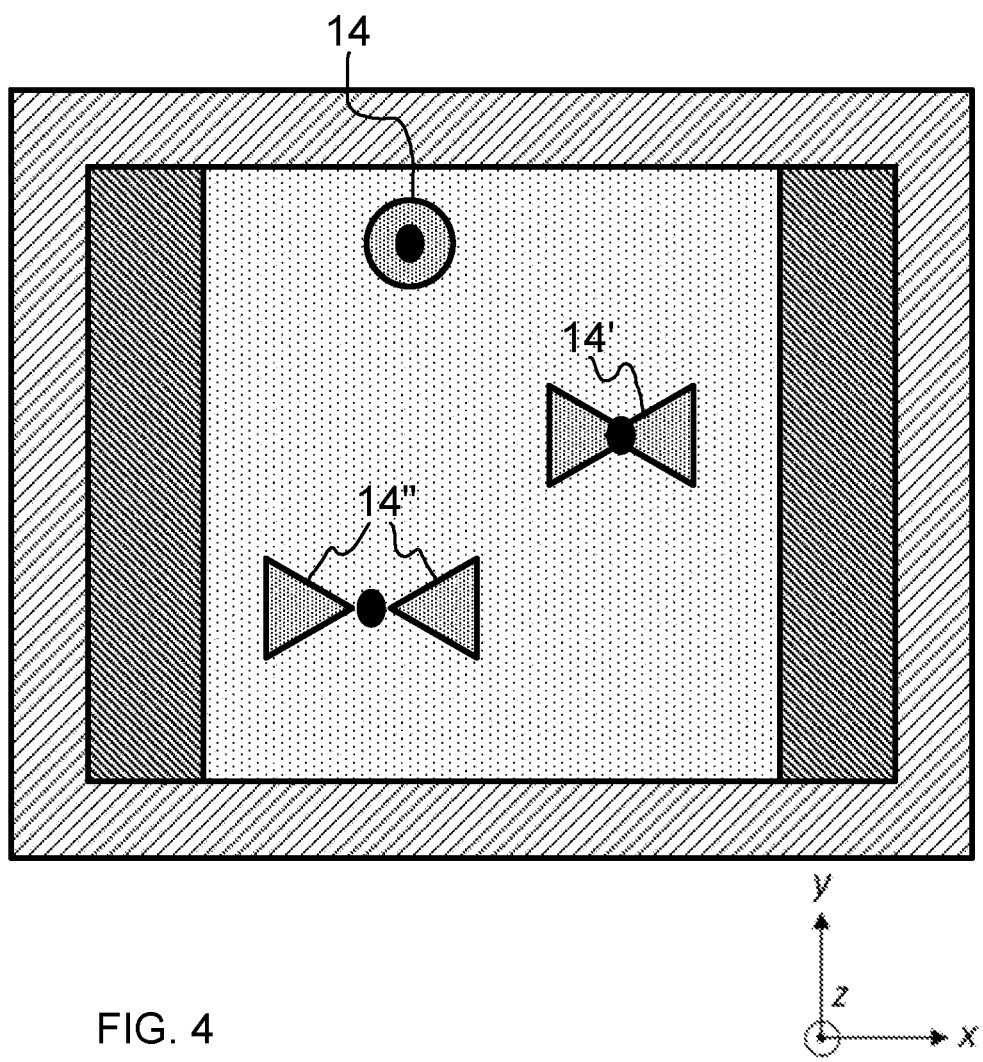
FIG. 4 depicts a two-dimensional top view of an alternative emission device, according to some embodiments of the disclosure.

In addition, at step S30, the phase of the PCM 12 may be changed (e.g., in a non-volatile manner) in each of one or more local areas 14 of the PCM. These areas form local phase alterations (e.g., local patterns), which are opposite to respective ones of the quantum emitters 16 in the matrix material layer 15. A local phase alteration may possibly be formed by a single local area 14 (as assumed in FIGS. 1A and 1B) or by two or more such local areas. The local areas may also have various possible shapes. For example, a local alteration may be formed by a single local area having approximately a cylindrical shape (as assumed in FIGS. 1A and 1B). However, a local alteration may also be formed by two or more local areas of changed phase. Plus, each local area may have a specific shape (e.g., local area 14' in FIG. 4). For example, a local alteration may be achieved thanks to two (possibly separated, e.g., local areas 14" in FIG. 4) areas having a bowtie shape. Such a structure may be sought to maximize the effect of dielectric enhancement with respect to simple cylindrical (or somehow circular) structures 14. More generally, the geometry and number of the local areas may be optimized to shape the electric field and/or tune its strength.

In all cases, the areas 14 form local phase alterations, which are in relation to the quantum emitters. That is, a local phase alteration surrounds or includes orthogonal projections of the emitters 16 in the PCM layer 12, as assumed in FIGS. 1A and 1B. In the example of bowtie alterations (e.g., local areas 14' and 14" in FIG. 4) formed by laterally opposite areas of changed phase, the electric field hotspot is located between the two local areas (which have triangular in-plane shapes). So, in that case, the orthogonal projections of the emitters are ideally located between the two opposite, bowtie areas.

Note, the numeral reference 1 may denote an emission device as obtained after having locally changed the phase of selected areas 14 of the PCM layer 12.

Changing the phase of the PCM in these areas 14 causes to locally modify the electric field at the respective quantum emitters 16, as illustrated in FIGS. 1A and 1B. The electric field applied is depicted as dashed lines 20. E.g., in these examples, the electric field is schematically visualized with a set of lines, such as lines 20, whose direction at each point is the same as the field's. The field is altered in the vicinity of the quantum emitters, thanks to the PCM areas 14 of altered phase.

Field alterations make it possible to individually tune the emission wavelength of the quantum emitters, in a programmatic way. E.g., the dimensions and crystalline state of the local areas 14 may be varied, as necessary to achieve the desired emission wavelengths. Note, the emission spectra of the quantum emitters may possibly be monitored in real time (e.g., while programming S30 the PCM layer 12), to adequately tune the emission wavelengths. In some embodiments, programming steps S30 are intermingled with spectrum measurement steps, to gradually tune the emission wavelengths (e.g., step by step). In some embodiments, a relevant procedure is applied, to directly form S30 areas 14 of known dimensions, e.g., by applying a given amount of radiation (heat or light) during predetermined time durations.

The PCM areas 14 are preferably obtained S30 using a radiation element 37, 38 such as a heated nanoscale probe tip 37 (FIG. 2A) or a laser device 38 (FIG. 2B). The radiation element 37, 38 may locally change the phase of the PCM (e.g., from amorphous to crystalline), in a non-volatile manner. This amounts to "program" the PCM layer 12. That the change is "non-volatile" means that the phase change may remain stable, even after interrupting the radiation (light or heat). The device 1 may possibly be reprogrammed, as necessary to operate the layered structure 12, 15, as discussed later in reference to some embodiments. So, the PCM can be chosen so as for the phase-changed areas 14 to be stable but not necessarily irreversible.

Note, step S30 may be performed after step S20. In some embodiments, the electric field may be applied (step S20) after having changed (step S30) the phase of the PCM in the local areas 14.

A modification of the electric field at the location of an emitter 16 may occur because of the change in the static permittivity obtained as per the phase change, e.g., once the crystalline phase is reached. This may enable a change to the local electric field strength experienced by each emitter 16 and, therefore, the strength of the Stark effect. The ability to change may permit the ability to individually tune the emission wavelength of each quantum emitter 16. The extent of the tuning may be related to the geometry of the (phase-changed) local areas 14 and the extent to which the phase is changed, e.g., the amount of crystallinity of the PCM in these areas.

Now referring to FIGS. 1A, 1B, the phase of the PCM 12, 14 may be changed S30 in the local areas 14 from an amorphous, or essentially amorphous, structure to a crystalline structure, or an essentially crystalline structure, as noted above. As a result, the remaining portions 12 of the PCM may include amorphous structure.

A sufficient difference of static relative permittivities between the two phases of the PCM 12 may be sought; the relative permittivity of a material for a zero frequency is known as its static relative permittivity. In particular, the PCM may advantageously be chosen such that, after having changed S30 the phase of the PCM 12, 14 in each local area 14, the static relative permittivity of the local areas 14 is at least 1.5 times larger than (or at least twice as large as) the static relative permittivity of the remaining portions 12. Note, in the present context, the static relative permittivities may be effective (or average) permittivities. The static permitivities between the two phases of the PCM 12, 14 may differ by a factor of at least 1.5, if not 2, to give rise to a sufficient change of the electric field density. Yet, this factor may possibly be slightly less than 2 in practice, while still providing satisfactory results.

For example, a PCM such as Ge2Sb2Te5 may lead to static permittivity of approximately 16 in the amorphous phase, while the static permittivity in the tetragonal phase is of approximately 30. Such a material may make it possible to obtain a sufficient change of the electric field density with a ratio of approximately 1.875. In some embodiments, performance may be obtained by using HfO2, which leads to a static permittivity of approximately 25 in the amorphous phase vs. approximately 125 in the tetragonal phase, corresponding to a ratio of approximately 5.

The present methods can be used in applications that require coupling electromagnetic emissions of (i) the individual quantum emitters with each other, (ii) the individual quantum emitters with a given wavelength of light (e.g., of remote quantum emitters), or (iii) one of the quantum emitters with optical cavity modes of the layered structure, as denoted by step S40 in the flowchart of FIG. 3.

The PCM may possibly be reprogrammed, e.g., as in FIG. 3. That is, after having locally changed the PCM to obtain first local areas 14 of changed phase, the PCM layer 12 may be restructured by changing S60 the phase in some or each of the first areas 14 back to their amorphous structure. E.g., the initial state of the PCM is restored, prior to changing S20 the PCM phase in each of one or more second local areas 14 from amorphous to crystalline. Like the first local alterations caused by the first local areas, the second local alterations caused by the second local areas 14 are in relation to respective quantum emitters 16 in the layer 15. This, again, may locally modify the electric field at the quantum emitters 16. That is, the second alterations are typically formed in relation to the quantum emitters 16, thanks to crystalline regions in the second local areas, where the second alterations may partly surround or may include the orthogonal projection of the quantum emitters in the PCM layer. The second areas may be roughly similar to the first areas, albeit larger (or smaller) and thicker (or thinner). In addition, the reprogramming may concern distinct areas. E.g., the PCM may possibly be reprogrammed to change the phase in a larger (or smaller) number of second areas 14, or in fully distinct areas (forming local alterations in relation to distinct quantum emitters), compared with a previous programming cycle. If necessary, the electric field may be switched off (step S50), prior to change S60 the phase of the local areas 14 back to the initial (amorphous) phase.

Referring now more specifically to FIGS. 2A and 2B, the phase of the PCM 12, 14 may be changed S30 using a radiation element 37, 38 that is controllably moved relative to the PCM layer 12. The radiation element may notably include a heated nanoscale probe tip 37 or a laser device 38. That is, the phase of the PCM can be changed by locally applying energy in the form of light or heat to each of the one or more local areas 14, e.g., through the matrix material layer 15 (or the substrate 11).

In the example of FIG. 2B, phase change may be achieved thanks to a laser beam generated by a laser device 38. In this example, the laser beam hits the PCM layer 12 from the top, through the matrix layer 15. In variants, the PCM layer 12 may be structured by applying the laser beam from below, e.g., through a sufficiently permissive substrate 11. In the example of FIG. 2A, the local areas 14 are obtained thanks to a heated, nanoscale probe tip 37. Like the laser device 38, the probe 33, 37 can be independently controlled and actuated in the apparatus 101. Several probe tips may possibly be concurrently used. However, embodiments relying on a single probe tip 37 may be contemplated, e.g., as a relatively small number of areas 14 (typically on the order of 100 or less) are to be formed, and/or area 14 which may have a small volume. The time required for a precise, local manipulation may be on the order of one second or less. The probe 33, 37 may possibly be heated via a heating element (not shown) in thermal contact with the probe tip or by applying an electrical signal to the probe 33 to heat the probe by Joules heating. In general, techniques derived from scanning tunneling microscopy (STM) and atomic force microscopy (AFM) may be used.

Another aspect of the disclosure may relate to an apparatus 101, 102, which can be used to implement methods according to the present disclosure. Two examples of such an apparatus as now described in reference to FIGS. 2A and 2B.

These apparats 101, 102 may include an emission device 1, an electrical circuit 32, and a radiation device. In addition, the apparatus 101, 102 may include various controllers 34, 35 and electrical circuits, as well as a moving stage.

The emission device 1 may include two electrodes 10 and a layered structure 12, 15. The electrodes 10 may be formed on-chip. The layered structure may include a PCM layer 12 and a matrix material layer 15, which extends over the PCM layer 12. Quantum emitters 16 may be embedded in the matrix material layer. Note, that the matrix material layer 15 extends over the PCM layer 12, may indicate that it is on top of the PCM layer 12 or below the PCM layer 12, depending on the orientation chosen.

The layer 15 may further extend between the two electrodes 10, e. g., in a vertical or horizontal (lateral) configuration. That is, the electrodes may be arranged on each side (top and bottom) of laterally with respect to the layered structure. Because the layer 12 and 15 are preferably in direct contact with each other (hence forming a bilayer structure), the electrode may sandwich both layers 12, 15, in either the vertical or horizontal configuration. The emission device 1 shown in FIGS. 1A and 1B depicts an example, horizontal, configuration.

The electrical circuit 32 may connect to the two electrodes 10. This circuit 32 is configured to generate, via the two electrodes 10, an electric field through the matrix material layer 15 and the PCM layer 12. In operation, the electric field may cause changes to the emission wavelengths of the quantum emitters 16, as explained earlier.

The radiation device may be configured to controllably change a phase of the PCM, in a non-volatile manner, in selected local areas 14 of the PCM. As explained earlier, such areas 14 may be formed opposite to respective ones of the quantum emitters 16 in the matrix material layer 15, to locally modify the electric field at the respective quantum emitters 16, in operation. E.g., achieved using a radiation element 37, 38. In some embodiments, the radiation element may be laser device 38. In other embodiments, the radiation element may be a heatable nanoscale probe tip 37, e.g., the tip 37 may be mounted on a cantilever 33 (FIG. 2A), such as in generally relevant from SPL techniques. In both cases, the apparatus 101, 102 may be configured to controllably move the radiation element 37, 38 relatively to the layered structure 12, 15. That is, the layered structure 12, 15 and the radiation element 37, 38 may be controllably moved with respect to each other, so as to be able to obtain selected areas 14 of changed phase.

In some embodiments, the apparatus 101, 102 may be configured to scan the radiation element 37, 38 relative to the layered structure 12, 15. Note, the distance characterizing the lateral precision (in the sense of resolution) may be smaller (or substantially smaller) than the average, lateral separation distance between the quantum emitters 16. This lateral separation distance may be measured along a direction that is parallel to an average plane of the layered structure, e.g., parallel to plane (x, y) in the examples of FIG. 1-2. For example, the apparatus 101, 102 may comprise a holder 31, on which the emission device 1 may be mounted. The holder may itself be mounted on a x-y stage 31, or form part thereof, e.g., in FIGS. 2A, 2B. The x-y stage 31 may be connected to a control system 35. Moreover, a further controller 34 may be connected to both the control system 35 and the radiation element 37, 38 to vertically move the radiation element 37, 38 to an optimal vertical position above the layered structure 12, 15.

Referring to FIGS. 1A and 1B, another aspect is now discussed, which concerns an emission device 1. As explained earlier, the device 1 may include a layered structure, e.g., a PCM layer 12, 14, as well as a matrix material layer 15 with quantum emitters 16 embedded therein, where the matrix material layer 15 may extend over the PCM layer 12, 14. Furthermore, the device 1 may include two electrodes 10, arranged on each side of the layered structure, in either a vertical or horizontal (e.g., lateral) configuration.

The electrodes 10 may allow an electric field to be generated through the matrix material layer 15, to change the emission wavelengths of the quantum emitters 16, in operation. Moreover, and as a result of programming the PCM layer 12, 14, the emission device 1 may include one or more local areas 14, opposite to respective ones of the quantum emitters 16 in the matrix material layer 15. The phase of the local areas 14 may be distinct from the phase of the remaining portions 12 of the PCM layer and may cause a local modification of the electric field at the respective emitters 16, in operation.

Note, various possible geometries are contemplated for the electrodes 10. In some embodiments, the electrodes 10 may be shaped as opposite parallelepipeds. In some embodiments, the electrodes 10 may form concentric rings and/or also include more than two electrodes. E.g., four electrodes on each side of the layered region, with which the field direction could be set in any direction in the plane parallel to the layered structure. In some embodiments, the electrodes 10 may form arrays to subdivide the layered region in smaller sub-regions, e.g., to be able to locally change the field orientation. Moreover, such subdivision may be used to dynamically change the emission wavelength of only a subset of quantum emitters by changing the voltage applied to the respective electrodes 10. In the horizontal configuration, the distance between the electrodes 10 may be between 2 and 1000 micrometers. The distance between the electrodes 10 may be between 10 and 100 micrometers. The distance between electrodes 10 may enable sufficiently high electric fields (0.1-1 MV/cm). More compact structures may be achieved with vertical configurations of the electrodes.

As discussed earlier, the PCM 12, 14 may notably include hafnium(IV) oxide ($HfO_2$). In some embodiments, the PCM layer includes a germanium-antimony-tellurium alloy (noted GeSbTe, or GST for short) or, more generally, an alloy including each of Ge, Sb, and Te, as well as additional elements, such as Se. The PCM layer may for instance include $Ge_2Sb_2Te_5$, as noted earlier. In some embodiments, the PCM layer may include $Ge_2Sb_2Se_4Te_1$, which combines a broadband transparency (1-18.5 µm) and a large optical contrast ($\Delta n=2.0$). As noted earlier, such materials allow a factor of approximately 1.5 (or more) to be achieved between the effective, static relative permittivities in the local areas 14 and in the remaining portions 12.

The matrix material layer 15 may for instance be a crystalline material or a polymer material. Suitable examples of crystalline materials may include crystalline semiconductors and organic crystals such as pentacene, dibenzoterrylene, and terylene. Examples of suitable polymers may include polystyrene, poly(methyl methacrylate), and styrene-ethylene-butylene-styrene.

The quantum emitters 16 may include or consist of epitaxially-grown semiconductor quantum dots, such as InAs/GaP quantum dots, or other relevant quantum dots suitable for electric field tuning. In some embodiments, the quantum emitters 16 may include or consist of colloidal quantum dots, e.g., II-VI or III-V semiconductors, or perovskites. The emitters 16 may include cadmium selenide (CdSe), e.g., a II-VI semiconductor of the n-type or metal halide perovskites ($APbX_3$ where A=Cs, $CH_3NH_3$, or $(NH_2CHNH_2)_{1-x}(CH_3NH_2)_x$ with $0 \leq x \leq 1$, and X=Cl, Br, or I). In some embodiments, single molecules (such as organic dyes) may be used. Other examples of quantum emitters can be contemplated, as listed earlier.

The layered structure 12, 14, 15 may be supported by an optically and electrically passive substrate 11, such as a substrate containing one or more: Si, GaAs, GaP, InP, an oxide (such as $SiO_2$ or $Al_2O_3$), and glass. The substrate may provide mechanical stability to the device 1. For completeness, the electrical contacts (electrodes) 10 may comprise any suitable electrical conductor, such as gold, silver, aluminum, indium tin oxide (ITO), tungsten, or a doped semiconductor.

In some embodiments, such as depicted in FIGS. 1A, 1B, the substrate 11 supports the layered structure 12, 14, 15.

The PCM layer 12, 14 may be sandwiched between the substrate 11 and the matrix material layer 15. The electrodes 10 may be patterned on the substrate 11 in a lateral configuration. That is, the layered structure 12, 15 extends laterally between the electrodes 10. In that case, the electric field is applied S20 parallel to the layered structure 12, 14, 15. In variants, vertical electrode configurations may be contemplated, where the electrodes are made from a sufficiently transparent material, such as ITO, or a doped semiconductor, allowing electric fields to be applied perpendicularly to the substrate plane.

That is, in the example of FIGS. 1A and 1B, the device 1 may include a matrix layer 15, on top of the PCM layer 12, 14, itself on top of the substrate 11. In variants, however, a distinct sequence may be contemplated, involving a PCM layer on top of a matrix layer, itself on top of the substrate. Such structures can both have a lateral electrode configuration. Moreover, vertical configurations may be contemplated, wherein, e.g., a top electrode layer extends on top of a bilayer structure (matrix-PCM or PCM-matrix), itself extending on top of a bottom electrode layer and a substrate. In that case, the top electrode may be made from an optically transparent material (e.g., ITO) to allow laser programming and light extraction from the quantum emitters.

The quantum emitters 16 may be separated by at least 50 nm (on average) in the matrix layer 15, e.g., in some embodiments where limited resolution of the radiation element 37, 38 are used to form the local areas 14. In some embodiments, the quantum emitters 16 may be laterally separated by at least 50 nm (on average). That is, the separation distance, as measured parallel to the (x, y) plane, may be larger than or equal to 50 nm. The separation distance may facilitate the quantum emitters 16 as individually addressable with respect to the PCM programming S30, to individually tune their emission wavelengths by electrical field tuning. In some embodiments, smaller separation distances may be contemplated, should smaller radiation resolution be available.

The average, in-plane dimension of the local areas 14 may be larger than the average, in-plane dimension of a quantum emitter, e.g., where local alterations are formed, each, by a single area 14, as in the example of FIGS. 1A and 1B. E.g., a local area may approximately have a cylindrical shape. Still, as discussed earlier, the local areas may have any suitable shape and be grouped to form local patterns (e.g., alterations), where a local pattern surrounds or includes the projected position of a respective quantum emitter. For example, the average, in-plane dimension of the local areas 14 may be between 50 and 5000 nm. In-plane dimensions are measured along a direction that is parallel to the average plane of the matrix material layer 15 (or the layered structure), e.g., parallel to (x, y) in FIGS. 1A and 1B. In some embodiments, an area 14 may be formed in relation to a single quantum emitter, and the in-plane dimension of this area may be on the same order as the average, in-plane separation distance between the quantum emitters. However, a single area 14 may possibly overlap with several quantum emitters 16 (and thereby tune several emitters at a time).

In some embodiments, the average thickness (or depth) of the local areas 14 may be typically larger than or equal to 1 nm. This thickness is measured perpendicularly to the matrix material layer 15, e.g., along direction z in the appended drawings. Furthermore, the thickness of the areas may be measured from the interface between the matrix material layer 15 and the PCM layer 12 since the areas 15 are typically formed right under the interface with the matrix material layer 15.

Note, the depth of the areas 14 may be equal to the thickness of the PCM layer 12, 14, as assumed in FIG. 1A. The PCM optical absorption at the emission wavelength of the quantum emitters may be kept small, such as by using materials with low absorption at the emitter wavelengths and/or sufficiently thin layers. Consequently, the average thickness of the PCM layer 12, 14 may be between 50 nm and 200 nm, and in some embodiments less than 100 nm. Meanwhile, the average thickness of the matrix material layer 15 may be between 20 nm and 200 nm.

While the present disclosure has been described with reference to a limited number of embodiments, variants, and the accompanying drawings, it will be understood by those skilled in the art that various changes may be made, and equivalents may be substituted without departing from the scope of the present disclosure. In particular, a feature (device-like or method-like) recited in a given embodiment, variant or shown in a drawing may be combined with or replace another feature in another embodiment, variant or drawing, without departing from the scope of the present disclosure. Various combinations of the features described in respect of any of the above embodiments or variants may accordingly be contemplated, that remain within the scope of the appended claims. In addition, many minor modifications may be made to adapt a particular situation or material to the teachings of the present disclosure without departing from its scope. Therefore, it is intended that the present disclosure is not limited to the particular embodiments disclosed, but that the present disclosure will include all embodiments falling within the scope of the appended claims. In addition, many other variants than explicitly touched above can be contemplated. For example, other materials than those explicitly mentioned herein may be contemplated, further device (and electrode) geometries may be used, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An emission device comprising:
   a layered structure including a layer of phase change material and a matrix material layer embedding one or more quantum emitters, wherein the matrix material layer extends over the layer of phase change material;
   two electrodes arranged on each side of the layered structure, so as to allow an electric field to be generated through the matrix material layer and the layer of phase change material, so as to change the emission wavelengths of the quantum emitters, in operation; and
   a substrate, over which extends the layer of phase change material, so as for the layer of phase change material to be between the substrate and the matrix material layer, wherein the layer of phase change material comprises one or more local areas that have a phase distinct from that of remaining portions of the layer of phase change material, thereby forming local phase alterations opposite to respective ones of the quantum emitters in the matrix material layer, so as to locally modify the electric field at the respective quantum emitters, in operation; and wherein the electrodes are patterned on the substrate, so as for the layered structure to extend between the electrodes.

2. The emission device according to claim 1, wherein the phase change material comprises one of GeSbTe and HfO2.

3. The emission device according to claim 1, wherein the matrix material layer comprises one of a crystalline material and a polymer material; and the quantum emitters comprise one of epitaxially-grown semiconductor quantum dots, colloidal quantum dots, and organic emitters.

4. The emission device according to claim 1, wherein an average distance between the quantum emitters in the matrix material layer is larger than or equal to 50 nm.

5. The emission device according to claim 1, wherein an average, in-plane dimension of said local areas is between 50 and 5000 nm, said average, in-plane dimension being measured along a direction that is parallel to an average plane of the matrix material layer.

6. The emission device according to claim 5, wherein an average thickness of said local areas is larger than or equal to 1 nm, said thickness measured perpendicularly to the matrix material layer and from an interface between the matrix material layer and the layer of phase change material.

7. The emission device according to claim 1, wherein an average thickness of the layer of phase change material is between 50 nm and 200 nm and an average thickness of the matrix material layer is between 20 nm and 200 nm.

8. The emission device according to claim 1, wherein an average, static relative permittivity of said local areas is at least twice as large as an average, static relative permittivity of said remaining portions.

9. The emission device according to claim 1, wherein one of the one or more local areas has a bowtie shape.

10. The emission device according to claim 9, wherein the bowtie shape comprises two opposing triangular shapes and the corresponding quantum emitter is positioned therebetween.

11. The emission device according to claim 1, wherein the substrate is an electrical insulator.

12. The emission device according to claim 1, wherein the substrate does not emit light.

13. The emission device according to claim 1, wherein the one or more local areas are in a crystalline phase and the remaining portions of the layer of phase change material are in an amorphous phase.

* * * * *